United States Patent
Wu et al.

(10) Patent No.: US 7,414,315 B2
(45) Date of Patent: Aug. 19, 2008

(54) DAMASCENE STRUCTURE WITH HIGH MOISTURE-RESISTANT OXIDE AND METHOD FOR MAKING THE SAME

(75) Inventors: Tsang-Jiuh Wu, Hsinchu (TW); Syun-Ming Jang, Hsinchu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 274 days.

(21) Appl. No.: 11/261,616

(22) Filed: Oct. 31, 2005

(65) Prior Publication Data

US 2007/0096264 A1    May 3, 2007

(51) Int. Cl.
*H01L 23/532* (2006.01)
(52) U.S. Cl. ................ 257/760; 257/E23.167
(58) Field of Classification Search ........ 257/759, 257/E23.154, E21.216; 438/628, 786
See application file for complete search history.

(56) References Cited

U.S. PATENT DOCUMENTS

| | | | | |
|---|---|---|---|---|
| 5,389,581 A | * | 2/1995 | Freiberger et al. | 438/622 |
| 6,051,870 A | * | 4/2000 | Ngo | 257/519 |
| 6,057,242 A | * | 5/2000 | Kishimoto | 438/692 |
| 6,407,011 B1 | * | 6/2002 | Ikeda et al. | 438/786 |
| 2002/0063336 A1 | * | 5/2002 | Matsubara | 257/758 |
| 2002/0076492 A1 | * | 6/2002 | Loan et al. | 427/255.28 |
| 2002/0175415 A1 | * | 11/2002 | Matsunaga | 257/758 |
| 2004/0137711 A1 | * | 7/2004 | Deguchi | 438/622 |

OTHER PUBLICATIONS

S.M. Jang et al., "Effects of PE-TEOS Process on $O_3$-TEOS Characteristics and Device Reliability", SPIE vol. 2636, 2002, pp. 307-316.

Y.M. Lin et al., "Improvement of Water-Related Hot-Carrier Reliability by Optimizing the Plasma-Enhanced Tetra-ethoxysilane Deposition Process", J. Electrochem. Soc., vol. 144, No. 8, Aug. 1997, pp. 2898-2903.

* cited by examiner

*Primary Examiner*—Carl Whitehead, Jr.
*Assistant Examiner*—Jennifer M Dolan
(74) *Attorney, Agent, or Firm*—Finnegan, Henderson, Farabow, Garrett & Dunner LLP

(57) ABSTRACT

A semiconductor device includes a substrate, an inter-metal dielectric (IMD) layer over the substrate, and either a nitrogen-containing tetraethoxysilane (TEOS) oxide layer or an oxygen-rich TEOS oxide layer over the IMD layer. The molecular ratio of oxygen in the oxygen-rich TEOS oxide layer is greater than 70%. The IMD layer comprises an extra-low dielectric constant (ELK) layer.

16 Claims, 4 Drawing Sheets

DAMASCENE STRUCTURE WITH HIGH MOISTURE-RESISTANT OXIDE AND METHOD FOR MAKING THE SAME

DESCRIPTION OF THE INVENTION

1. Field of the Invention

This invention relates in general to semiconductor devices and, more particularly, to a dual damascene structure using a moisture resistant oxide on a dielectric layer and the method for forming the same.

2. Background of the Invention

A semiconductor IC includes several layers of metals to provide contacts among circuit elements of the IC and between the IC and external circuits. Inter-metal dielectric (IMD) layers are provided between the metal layers to isolate the metal layers from each other. When the metal contacts are embedded in the IMDs and polished to achieve a planar structure, the planar structure is referred to as a damascene structure. When both metal contacts and interconnects (or vias) between metal layers are formed in the IMDs, the structure is referred to as a dual damascene structure.

Materials having low dielectric constants or extra-low dielectric constants (ELK) are used as the IMDs to minimize a coupling effect between the layers of metals. A problem with ELK materials is their low moisture resistance. During processing, moisture is absorbed in the ELK layer and deteriorates device performance. FIGS. 1A-1C illustrate a process of forming a damascene structure 100 with a layer of SiC for protecting ELK material from moisture.

In FIG. 1A, a substrate 102 is provided. Substrate 102 may comprise a semiconductor substrate having devices or circuits formed thereon. A first metal layer 104 is formed on substrate 102 and embedded in a first dielectric layer 106. An etch stop layer (ESL) 108 is formed on first metal layer 104 and first dielectric layer 106. An ELK layer 110 is formed on ESL 108. A first layer of tetraethoxysilane (TEOS) oxide 112 is formed on ELK layer 110. A layer of silicon carbide (SiC) 114 is formed on TEOS 112. A second layer of TEOS oxide 116 is formed on SiC 114.

In FIG. 1B, second layer of TEOS oxide 116, SiC 114, first layer of TEOS oxide 112, and ELK layer 110 are etched to form a trench 118. A metal barrier layer 120 and a metal layer 122 are sequentially deposited over second layer of TEOS oxide 116 and in trench 118. Metal barrier layer 120 comprises a dielectric or a metal for preventing the metal in metal layer 122 from diffusing into underlying layers. Metal layer 122 may comprise any suitable metal for providing contacts, such as copper.

In FIG. 1C, a chemical-mechanical polishing (CMP) step is performed to remove the whole of second layer of TEOS oxide 116 and SiC 114 and a part of first layer of TEOS oxide 112, metal barrier layer 120, and metal 122. As a result, a second metal layer 124 and a metal barrier 126 are formed in trench 118 to form a damascene structure 100.

Substrate 102 having damascene structure 100 formed thereon may be subjected to further processing to form additional devices or circuits.

In damascene structure 100 described above, TEOS oxides 112 and 116 are used to provide conformal and smooth surfaces. TEOS oxides may be formed by chemical vapor deposition (CVD) or plasma-enhanced CVD (PECVD using a source gas including TEOS, oxygen, and helium. Typically, a flow rate of TEOS is approximately 560 sccms (standard cubic centimeter per minute), and a flow rate of oxygen is approximately 840 sccms. Helium is a carrier for carrying TEOS. The source power for the CVD or PECVD process is approximately 375 W and the power of an RF provided from the bottom of substrate 102, i.e., a bottom power, is approximately 83 W.

Because TEOS generally has a poor moisture resistance and cannot provide moisture protection for ELK 110, SiC 114, which has a high moisture resistance, is deposited over TEOS 112 and ELK layer 110 for moisture protection. However, SiC has a high dielectric constant and must be removed during the CMP step to reduce capacitive coupling effect between layers of metals. Thus, ELK layer 110 is not protected in the processing steps subsequent to the CMP step, and moisture may still enter ELK layer 110 and deteriorate the device performance. Moreover, manufacturing the TEOS/SiC/TEOS (112/114/116) multilayer structure is complicated, and SiC is difficult to polish and etch.

SUMMARY OF THE INVENTION

A semiconductor device consistent with embodiments of the present invention includes a substrate, an inter-metal dielectric (IMD) layer over the substrate, and a nitrogen-containing tetraethoxysilane (TEOS) oxide layer over the IMD layer.

A semiconductor device consistent with embodiments of the present invention includes a substrate, an inter-metal dielectric (IMD) layer over the substrate, and an oxygen-rich TEOS oxide layer over the IMD layer. The molecular ratio of oxygen in the TEOS oxide layer is greater than 70%.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1A:
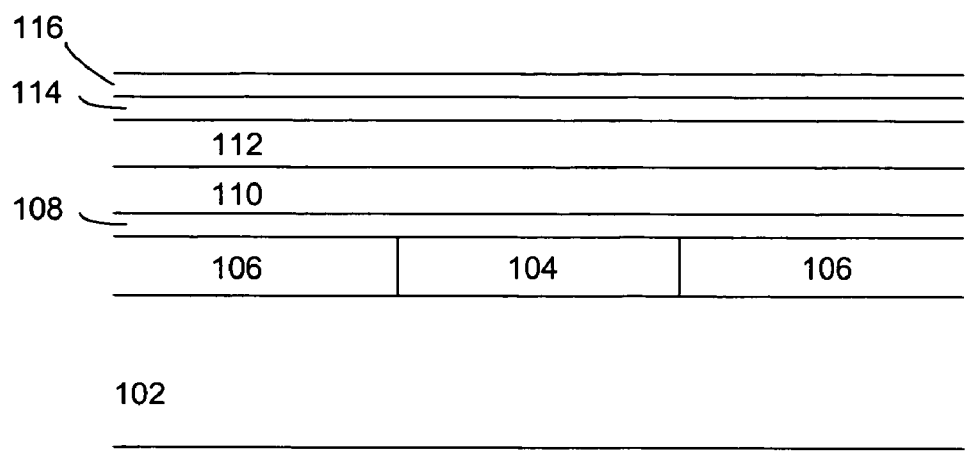
FIGS. 1A-1C illustrate a method for forming a conventional semiconductor device having a damascene structure.
Figure 1B:
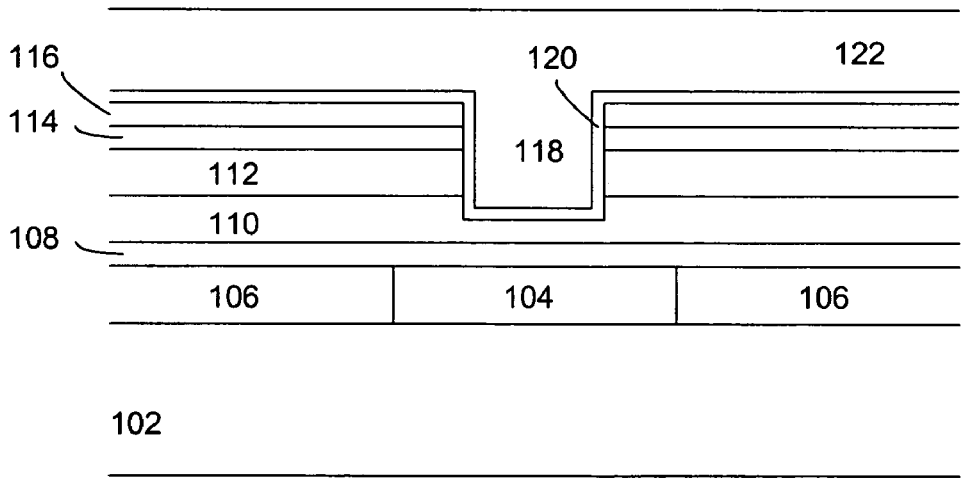
Figure 1C:
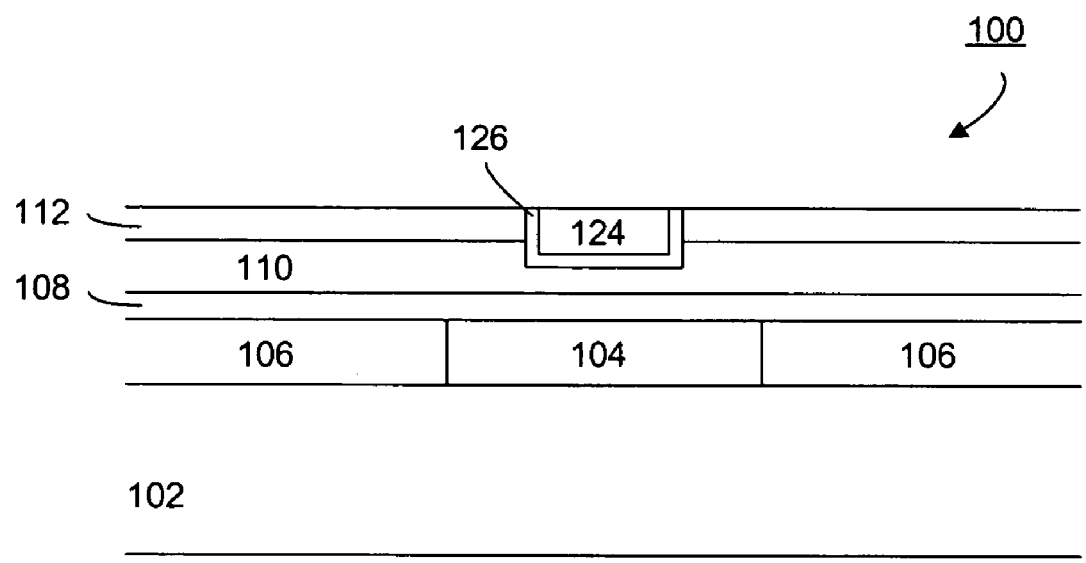

Consistent with embodiments of the present invention, there is provided a damascene structure including a high moisture-resistant TEOS oxide over an ELK layer. With the use of the high moisture-resistant TEOS oxide, the damascene structure consistent with embodiments of the present invention does not require the deposition of the TEOS/SiC/TEOS multilayer shown in FIGS. 1A-1C. Accordingly, the manufacturing process of the damascene structure consistent with embodiments of the present invention is simpler.

Figure 2:
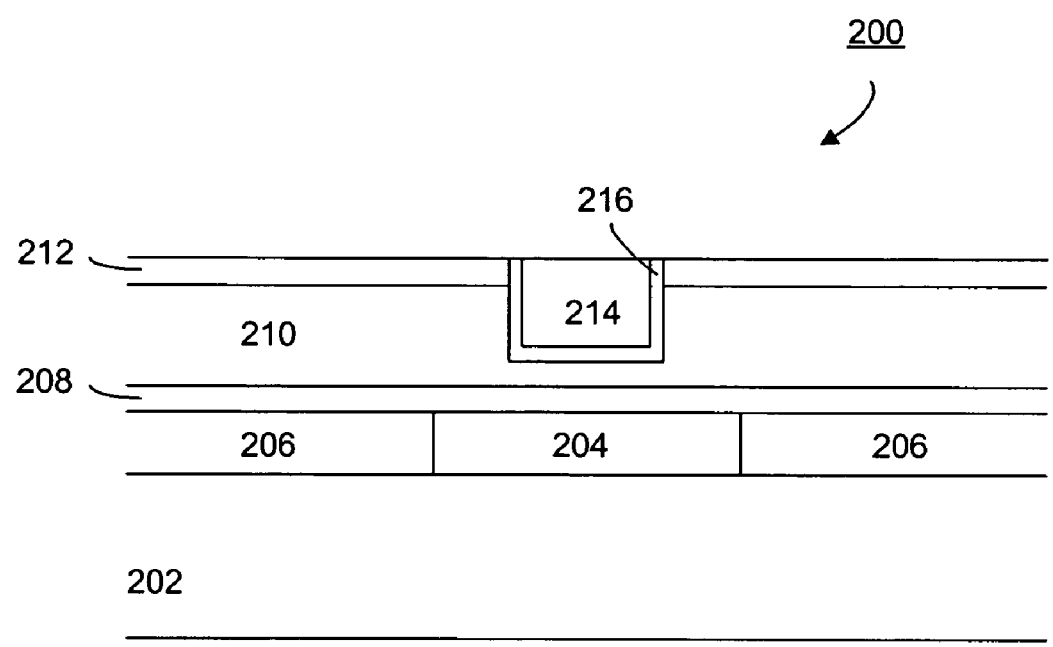
FIG. 2 shows a damascene structure consistent with embodiments of the present invention.

FIG. 2 shows a damascene structure 200 consistent with embodiments of the present invention. As FIG. 2 shows, damascene structure 200 is formed on a substrate 202. Substrate 202 may comprise a semiconductor substrate having devices or circuits formed thereon. Damascene structure 200 includes a first metal layer 204 formed on substrate 202 and embedded in an inter-layer dielectric (ILD) layer 206. An etch stop layer (ESL) 208 is formed on first metal layer 204 and ILD layer 206. An ELK layer 210 is formed on ESL 208. ELK layer 210 serves as an inter-metal dielectric (IMD) layer. A layer of TEOS oxide 212 is formed on ELK layer 210. A second metal layer 214 is embedded in TEOS oxide 212 and ELK 210. A metal barrier layer 216 is provided between second metal layer 214 and TEOS oxide 212 and between second metal layer 214 and ELK layer 210. Metal barrier layer 216 comprises a dielectric or a metal for preventing the metal in second metal layer 214 from diffusing into underlying layers. First metal layer 204 and second metal layer 214 may each comprise any suitable metal for providing contacts, e.g., copper. ELK layer 210 may comprise a material with a dielectric constant of less than 2.5 grown by a CVD process or spin-on process, such as SiOCH.

Consistent with embodiments of the present invention, TEOS oxide 212 has a higher moisture resistance as compared to conventional TEOS. In one aspect, TEOS oxide 212 contains nitrogen. In another aspect, TEOS oxide 212 contains more than 70% of oxygen in molecular ratio.

Figure 3A:
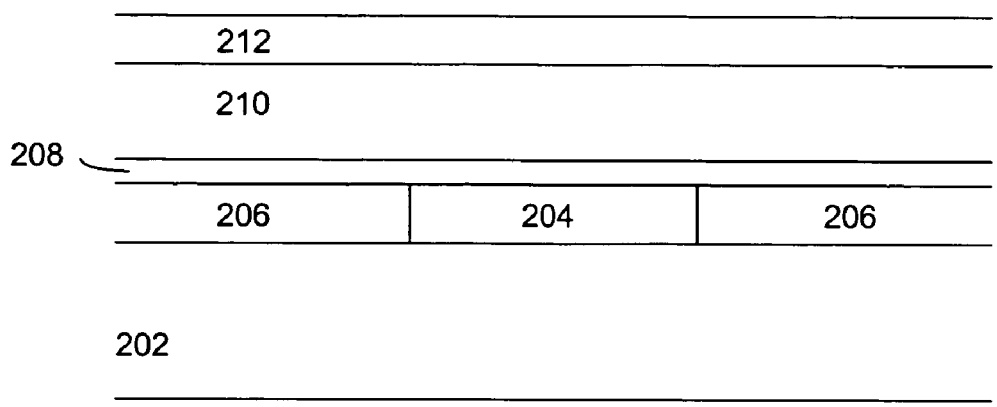
FIGS. 3A-3B illustrate a method for forming the damascene structure consistent with embodiments of the present invention.
Figure 3B:
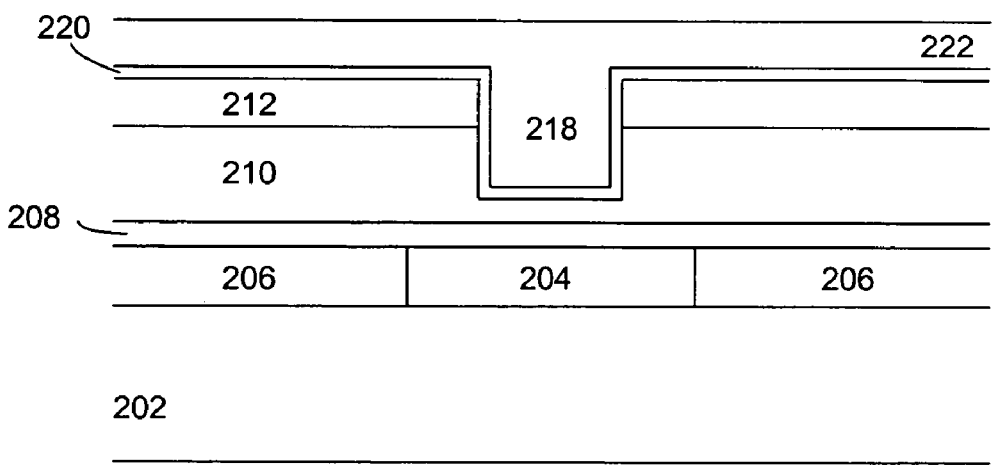

FIGS. 3A-3B illustrate a method for forming damascene structure 200 consistent with embodiments of the present invention.

In FIG. 3A, substrate 202 is provided. ILD layer 206 is formed on substrate 202 by depositing a layer of dielectric material. ILD layer 206 is patterned to form a trench (not numbered) for first metal layer 204. First metal layer 204 is then formed in the trench in ILD layer 206 by first depositing a layer of metal and then polishing the surface thereof. ESL 208 is formed on first metal layer 204 and ILD layer 206. ELK layer 210 is formed on ESL 208. Then, TEOS oxide 212 is deposited on ELK layer 210.

A CVD or PECVD process using a source gas including TEOS and nitrous oxide ($N_2O$) carried in helium may form a nitrogen-containing TEOS oxide as TEOS oxide 212. In the source gas, a flow rate of TEOS is approximately 350 sccms and a flow rate of $N_2O$ is approximately 1150 sccms. The source power for the CVD or PECVD process is approximately 185 W and the bottom power is approximately 145 W.

Alternatively, a CVD or PECVD process using a source gas including TEOS and oxygen carried in helium may form an oxygen-rich TEOS oxide as TEOS oxide 212. In the source gas, a flow rate of TEOS is approximately 300 sccms and a flow rate of oxygen is approximately 510 sccms. The source power for the CVD or PECVD process is approximately 450 W and the bottom power is approximately 75 W. In one aspect, the molecular ratio of oxygen in oxygen-rich TEOS oxide 212 is greater than 70%.

In FIG. 3B, TEOS oxide 212 and ELK layer 210 are etched to form a trench 218. A layer of metal barrier material 220 and a layer of metal 222 are sequentially deposited over TEOS oxide 212 and in trench 218.

Then, a chemical-mechanical polishing (CMP) step is performed. As a result, TEOS oxide 212, the layer of metal barrier material 220, and the layer of metal 222 are partly removed, forming second metal layer 214 and metal barrier layer 216 in trench 218, as shown in FIG. 2.

TEOS oxide 212, either nitrogen-containing or oxygen-rich, formed by methods consistent with embodiments of the present invention, has a high moisture resistance. Infrared spectroscopy has been performed to compare the damascene structure consistent with embodiments of the present invention with the conventional damascene structure such as damascene structure 100 described above. The conventional damascene structure shows peak moisture absorption at several resonant frequencies, including, e.g., 3650 cm$^{-1}$ (corresponding to Si—OH) and 960 cm$^{-1}$ (corresponding to Si—OH bonded to $H_2O$). In contrast, the nitrogen-containing or oxygen-rich TEOS oxide consistent with embodiments of the present invention show no significant moisture absorption.

By replacing the TEOS/SiC/TEOS multilayer structure in conventional damascene structures, embodiments of the present invention simplify the damascene structure and method for forming the same, and reduce cost for manufacturing semiconductor devices having damascene structures.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
   a substrate;
   an inter-metal dielectric (IMD) layer over the substrate;
   a nitrogen-containing tetraethoxysilane (TEOS) oxide layer over the IMD layer; and
   a metal line embedded in the TEOS oxide layer and the IMD layer,
   wherein a top surface of the metal line is substantially coplanar with a top surface of the TEOS oxide layer.

2. The semiconductor device of claim 1, wherein the substrate comprises a semiconductor substrate having devices or circuits formed thereon.

3. The semiconductor device of claim 1, further comprising a metal layer over the substrate, wherein the IMD layer is over the metal layer.

4. The semiconductor device of claim 3, further comprising an inter-layer dielectric (ILD) layer over the substrate, wherein the metal layer is in the ILD layer.

5. The semiconductor device of claim 4, further comprising an etch stop layer (ESL) over the ILD layer and the metal layer, wherein the IMD layer is over the ESL.

6. The semiconductor device of claim 1, wherein the IMD layer comprises an extra-low-dielectric-constant (ELK) layer.

7. The semiconductor device of claim 1, wherein the metal line is provided in a trench in the TEOS oxide layer and the IMD layer.

8. The semiconductor device of claim 7, further comprising a metal barrier layer between the metal line and the TEOS oxide layer and between the metal line and the IMD layer.

9. A semiconductor device, comprising:
   a substrate;
   an inter-metal dielectric (IMD) layer over the substrate; and
   an oxygen-rich tetraethoxysilane (TEOS) oxide layer over the IMD layer, a molecular ratio of oxygen in the TEOS oxide layer being greater than 70%; and a metal line embedded in the TEOS oxide layer and the IMD layer, wherein a top surface of the metal line is substantially coplanar with a top surface of the TEOS oxide layer.

10. The semiconductor device of claim 9, wherein the substrate comprises a semiconductor substrate having devices or circuits formed thereon.

11. The semiconductor device of claim 9, further comprising a metal layer over the substrate, wherein the IMD layer is over the metal layer.

12. The semiconductor device of claim 11, further comprising an inter-layer dielectric (ILD) layer over the substrate, wherein the metal layer is in the ILD layer.

13. The semiconductor device of claim 12, further comprising an etch stop layer (ESL) over the ILD layer and the metal layer, wherein the IMD layer is over the ESL.

14. The semiconductor device of claim 9, wherein the IMD layer comprises an extra-low-dielectric-constant (ELK) layer.

15. The semiconductor device of claim 9, wherein the metal line is provided in a trench in the TEOS oxide layer and the IMD layer.

16. The semiconductor device of claim 15, further comprising a metal barrier layer between the metal line and the TEOS oxide layer and between the metal line and the IMD layer.

* * * * *